United States Patent
Lin et al.

(10) Patent No.: US 9,514,986 B2
(45) Date of Patent: Dec. 6, 2016

(54) DEVICE WITH CAPPED THROUGH-SUBSTRATE VIA STRUCTURE

(71) Applicant: Taiwan Semiconductor Manufacturing Company, Ltd., Hsin-Chu (TW)

(72) Inventors: Yung-Chi Lin, Su-Lin (TW); Yen-Hung Chen, Hsinchu (TW); Yin-Hua Chen, Yuanlin Township (TW); Ebin Liao, Xinzhu (TW); Ku-Feng Yang, Dali (TW); Tsang-Jiuh Wu, Hsin-Chu (TW); Wen-Chih Chiou, Zhunan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/012,108

(22) Filed: Aug. 28, 2013

(65) Prior Publication Data

US 2015/0061147 A1    Mar. 5, 2015

(51) Int. Cl.
*H01L 23/48* (2006.01)
*H01L 21/768* (2006.01)
*H01L 23/532* (2006.01)

(52) U.S. Cl.
CPC ...... *H01L 21/76898* (2013.01); *H01L 23/481* (2013.01); *H01L 23/53238* (2013.01); *H01L 21/76849* (2013.01); *H01L 23/53223* (2013.01); *H01L 23/53252* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 7,205,233 B2 * | 4/2007 | Lopatin | C23C 18/1651 | 257/E21.174 |
| 8,587,131 B1 * | 11/2013 | Huang | H01L 23/481 | 257/778 |
| 8,658,529 B2 * | 2/2014 | Idani | H01L 21/76816 | 438/622 |
| 8,916,468 B2 * | 12/2014 | Ochimizu | H01L 23/481 | 257/E21.585 |
| 2005/0014360 A1 * | 1/2005 | Yu | H01L 21/76867 | 438/622 |
| 2009/0093100 A1 * | 4/2009 | Xia | C23C 16/325 | 438/421 |
| 2009/0160020 A1 * | 6/2009 | Barth | H01L 23/5223 | 257/532 |
| 2010/0237502 A1 * | 9/2010 | Yu et al. | | 257/751 |
| 2011/0080185 A1 * | 4/2011 | Wu et al. | | 324/750.3 |
| 2011/0241040 A1 * | 10/2011 | Yu et al. | | 257/91 |
| 2013/0020719 A1 * | 1/2013 | Jung et al. | | 257/774 |
| 2013/0200526 A1 * | 8/2013 | Moon et al. | | 257/774 |
| 2013/0285125 A1 * | 10/2013 | Chen | H01L 24/13 | 257/288 |
| 2013/0285694 A1 * | 10/2013 | Graves-Abe et al. | | 324/762.01 |
| 2013/0320554 A1 * | 12/2013 | Barth | | 257/774 |
| 2014/0084473 A1 * | 3/2014 | Moon et al. | | 257/751 |
| 2015/0115459 A1 * | 4/2015 | Chen | H01L 23/481 | 257/774 |

* cited by examiner

*Primary Examiner* — Marc Armand
*Assistant Examiner* — Younes Boulghassoul
(74) *Attorney, Agent, or Firm* — Slater Matsil, LLP

(57) ABSTRACT

A device including a first dielectric layer on a semiconductor substrate, a gate electrode formed in the first dielectric layer, and a through-substrate via (TSV) structure penetrating the first dielectric layer and extending into the semiconductor substrate. The TSV structure includes a conductive layer, a diffusion barrier layer surrounding the conductive layer and an isolation layer surrounding the diffusion barrier layer. A capping layer including cobalt is formed on the top surface of the conductive layer of the TSV structure.

19 Claims, 4 Drawing Sheets

DEVICE WITH CAPPED THROUGH-SUBSTRATE VIA STRUCTURE

BACKGROUND

Semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area. These integration improvements are essentially two-dimensional (2D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding. More recent attempts have focused on through-substrate vias (TSVs). Generally, the TSV is formed by etching an opening through a substrate and filling the opening with a conductive material, such as copper. The backside of the substrate is thinned to expose the TSVs, and another die is bonded to the exposed TSVs, thereby forming a stacked-die package.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
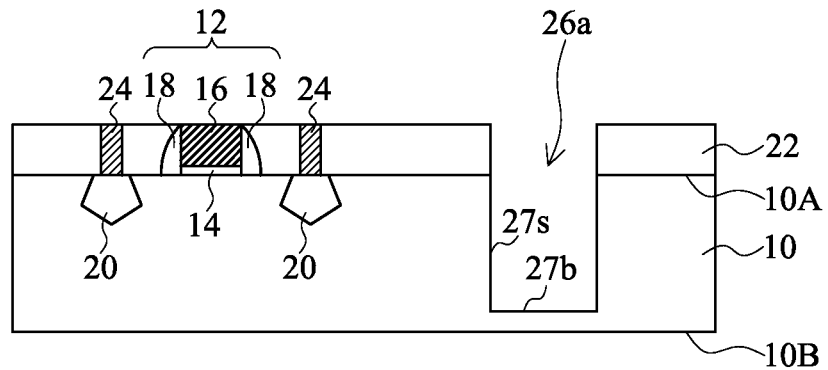
FIGS. 1 to 6 are cross-sectional views of intermediate stages in the manufacturing of a device with a through-substrate via structure before forming first level of metal layers in accordance with some exemplary embodiments.

It is to be understood that the following disclosure provides many different embodiments, or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 1-6 are cross-sectional views illustrating intermediate stages of a method for forming a semiconductor device with a through substrate via (TSV) structure according to some embodiments.

Referring to FIG. 1, a semiconductor substrate 10 is provided for manufacturing a device with TSV structures. The semiconductor substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. A metal-oxide semiconductor (MOS) transistor 12 is formed on a frontside surface 10A of the semiconductor substrate 10. The MOS transistor 12 may include N-type metal-oxide semiconductor (NMOS) and/or P-type metal-oxide semiconductor (PMOS) devices. In an embodiment, the MOS transistor 12 includes a gate dielectric layer 14, a gate electrode 16, and gate spacers 18 on the sidewalls of gate dielectric layer 14 and gate electrode 16. Source and drain regions 20 (referred to as source/drain regions hereinafter) are formed in the semiconductor substrate 10. Source/drain regions 20 are doped with a p-type or an n-type impurity, depending on the conductivity type of the respective MOS transistor 12. Source/drain regions 20 may also include stressors for applying stresses to the channel region of MOS transistor 12, wherein the stressors may be silicon germanium stressors or silicon carbon stressors. Although not shown, source/drain silicides may be formed as the top portions of source/drain regions 20, and/or the top portion of gate electrode 16. The gate electrode 16 may be a metal gate that is formed of metal or metal alloy(s), although gate electrode 16 may also be formed of polysilicon, metal silicides, or the like. The gate electrode 16 is formed in an inter-layer dielectric (ILD) layer 22, and the ILD layer 22 may be formed of an oxide such as phosphosilicate glass (PSG), borosilicate glass (BSG), boron-doped phosphosilicate glass (BPSG), tetraethyl ortho-silicate (TEOS) oxide, or the like. In some embodiments, the gate electrode 16 is formed using a gate-last approach, although the gate-first approach may be adopted. The top surface of gate electrode 16 may be level with the top surface of the ILD layer 22. Contact plugs 24 are formed in the ILD layer 22, and are overlapping and electrically coupled to source/drain regions 20. In some embodiments, the top surfaces of the contact plugs 24, the gate electrode 16, and/or the ILD layer 22 are level with each other.

FIG. 1 also depicts the formation of an opening 26a penetrating the ILD layer 22 and extending into a depth of the semiconductor substrate 10. In an embodiment, the opening 26a has a sidewall portion 27s and a bottom portion 27b. The opening 26a may stop at an intermediate level between the frontside surface 10A and the backside surface 10B of the semiconductor substrate 10. In defining the opening 26a, for example, a hard mask layer and a patterned photoresist layer (not shown in figures) are formed thereon followed by performing a wet or dry etch process. After the formation of the opening 26a, the hard mask layer and the photoresist layer are removed. The etch process may be such that the opening 26a is etched from the frontside surface 10A to reach approximately tens of micron~hundreds of micron in depth without passing through the backside surface 10B. The etching process may result in the opening 26a having a vertical sidewall profile or a tapered sidewall profile. In an embodiment, the opening 26a has a depth of approximately 20~100 um, and a diameter of approximately 1.5~15 um. The opening 26a has a high aspect ratio between approximately 5 and approximately 10. In some embodiments, the aspect ratio of the opening 26a is greater than 10.

Figure 2:
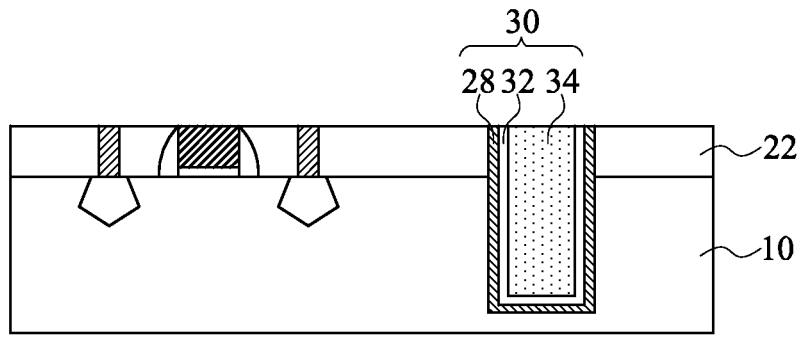

Next, as shown in FIG. 2, a TSV structure 30 including an isolation layer 28, a diffusion barrier layer 32 and a conductive layer 34 is formed in the opening 26a according to an embodiment. In some embodiments, the excess material portions of the layers 28, 32 and 34 positioned outside the opening 26a are removed, through a chemical mechanical polishing (CMP) process. Thus, the upper surface of the TSV structure 30 is substantially coplanar with the upper surface of ILD layer 22.

The isolation layer 28 is deposited to line the sidewall portions 27s and bottom portion 27b of the opening 26a in order to prevent any conducting material from leaching into any active portions of the circuitry of the semiconductor substrate 10. The isolation layer 28 may be formed of silicon oxide, TEOS oxide, silicon nitride, combinations thereof, or the like. The deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition), ALD (atomic layer deposition), PEALD (plasma-enhanced atomic layer deposition) and future-developed deposition procedures. For example, an LPCVD or PECVD process with TEOS and $O_3$ may be employed to form a TEOS oxide film.

The diffusion barrier layer 32 is formed on the isolation layer 28, along the sidewall portions 27s and bottom portion 27b of the opening 26a. The diffusion barrier layer 32 can prevent metal diffusion and functions as an adhesion layer between metal and dielectric in accordance with some embodiments. Refractory metals, refractory metal-nitrides, refractory metal-silicon-nitrides and combinations thereof are used for the diffusion barrier layer 32. The diffusion barrier layer 32 may include, but is not limited to, a refractory material, TiN, TaN, Ta, Ti, TiSN, TaSN, and mixtures thereof, or other materials that can inhibit diffusion of copper into the ILD layer 22, deposited by means of PVD, CVD, ALD or electroplating. In an embodiment, the diffusion barrier layer 32 includes a TaN layer and a Ta layer. In another embodiment, the diffusion barrier layer 32 is a TiN layer. In another embodiment, the diffusion barrier layer 32 is a Ti layer.

The conductive layer 34 is formed on the diffusion barrier layer 32 and fills the opening 26a. The conductive layer 34 includes a low resistivity conductor material selected from the group of conductor materials including, but not limited to, copper and copper-based alloys. For example, a copper-fill process includes metal seed layer deposition and copper electro plating. Alternatively, the conductive layer 34 includes various materials, such as tungsten, aluminum, gold, silver, and the like.

Figure 3:
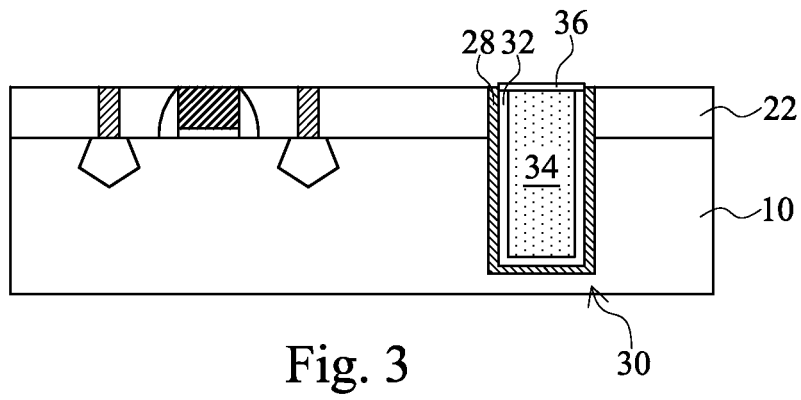

Next, as shown in FIG. 3, a capping layer 36 is formed on the exposed surface of the conductive layer 34 in accordance with an embodiment. The capping layer 36 extends from the exposed surface of the conductive layer 34 to the exposed surface of the diffusion barrier layer 32 in accordance with some embodiments. The capping layer 36 is a metallization layer including cobalt (Co) or a Co-based alloy (such as CoWBP or CoWP). The capping layer 36 is employed to inhibit Cu diffusion and migration. By electroless plating process or immersion plating process or CVD process, the capping layer 36 is selectively formed on the exposed surfaces of the conductive layer 34 and/or the diffusion barrier layer 32. By using the electroless plating or CVD process, the thickness of the capping layer 36 may be accurately controlled. In some embodiments, the capping layer 36 has a thickness about 0.1~10 μm. The capping layer 36 may be a single-layered structure, a dual-layered structure or a triple-layered structure. In some embodiments, the formation of capping layer 36 can provide good thermal stability and can control the topography of the TSV structure 30 so as to avoid copper extrusion which may cause a via open, dielectric crack, or ILD thickness loss.

Figure 4:
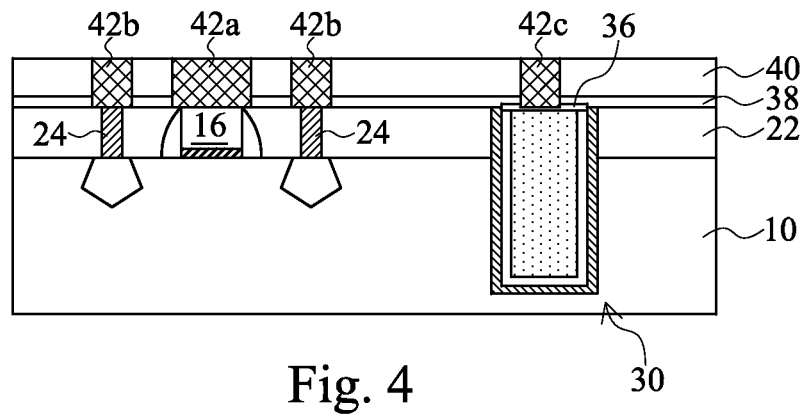

Referring to FIG. 4, a first etch stop layer 38 and a first inter-metal dielectric (IMD) layer 40 are formed to cover the capping layer 36, the TSV structure 30, the ILD layer 22 and the contact plugs 24. First level of metal layers including contact vias 42a, 42b and 42c are then formed in openings penetrating the first IMD layer 40 and the first etch stop layer 38 so as to electrically connect, and may be in physical contact with, the gate electrode 16, contact plug 24 and the TSV structure 30 respectively. In some embodiments, the first etch stop layer 38 is formed of silicon nitride or other dielectric materials, and the first IMD layer 40 is formed of silicon oxide, silicon oxycarbide, TEOS oxide, or the like. The formation process of the contact vias 42a, 42b and 42c may include forming openings in the first IMD layer 40 and the first etch stop layer 38, filling the openings with an adhesion/barrier layer and a metallic material such as tungsten or copper, and performing a CMP.

Figure 5A:
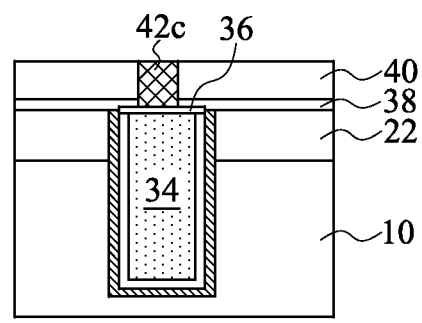
Figure 5B:
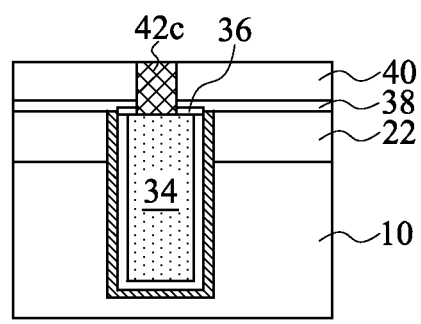

By process control, the contact via 42c formed on the TSV structure 30 can land on the capping layer 36 or penetrates the capping layer 36 to contact the conductive layer 34. In an embodiment, as shown in FIG. 5A, the contact via 42c is formed in the opening penetrating the first IMD layer 40 and the first etch stop layer 38 so as to physically contact with the capping layer 36. In another embodiment, as shown in FIG. 5B, the contact via 42c is formed in the opening penetrating the first IMD layer 40, the first etch stop layer 38 and the capping layer 36 so as to electrically connect and physically contact with the conductive layer 34.

Figure 6:
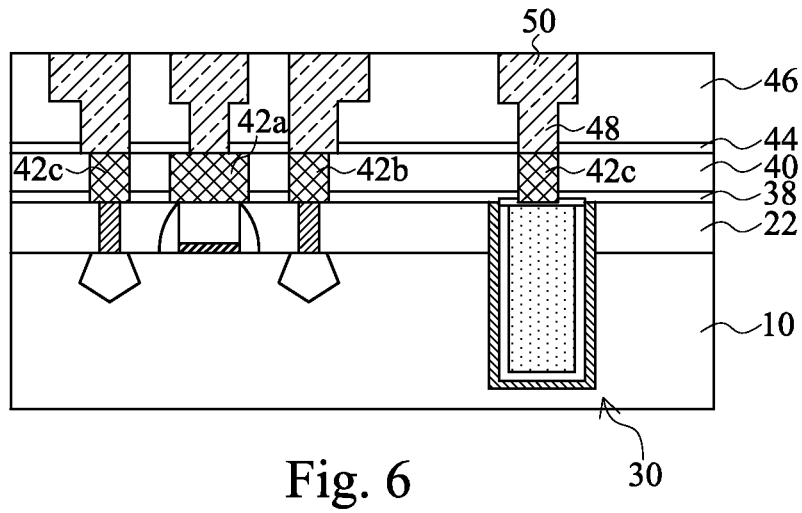

In subsequent process, as shown in FIG. 6, a second etch stop layer 44 and a second IMD layer 46 are successively formed over the first IMD layer 40, and then second level of metal layers including metal vias 48 and metal lines 50 are formed in the second etch stop layer 44 and the second IMD layer 46. The second IMD layer 46 may be formed of a low-k dielectric material having a k value smaller than about 3.0, or smaller than about 2.5, for example. In some embodiments, the metal via 48 and metal line 50 are formed using a dual-damascene process, which includes forming a diffusion barrier layer (such as Ti/TiN/Ta/TaN) lining a dual-damascene opening and forming a copper-containing material over the diffusion barrier layer within the opening. In alternative embodiments, each of the metal via 48 and metal line 50 is formed using a single-damascene process. The metal vias 48 and metal lines 50 are formed to electrically connect to the contact vias 42a, 42b and 42c. In subsequent process, more metal layers (not shown) may be formed over the metal lines 50. Another etch stop layer may then be formed, and further metal lines and vias (not shown) may be formed in more dielectric layers to electrically couple to TSV structure 30 and the contact plugs 24.

Figure 7:
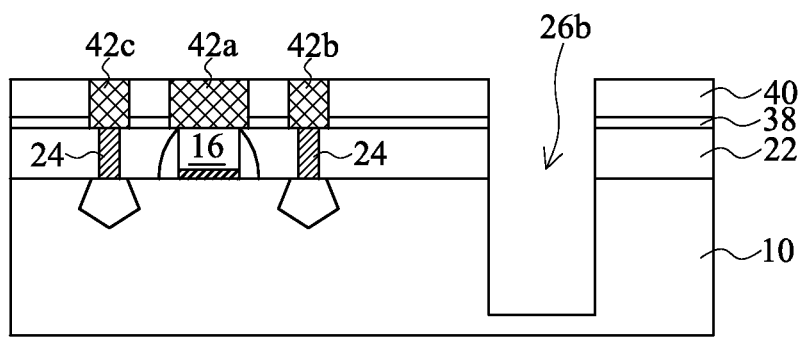
FIGS. 7 to 9 are cross-sectional views of intermediate stages in the manufacturing of a device with a through-substrate via structure after forming first level of metal layers in accordance with some exemplary embodiments.
Figure 8:
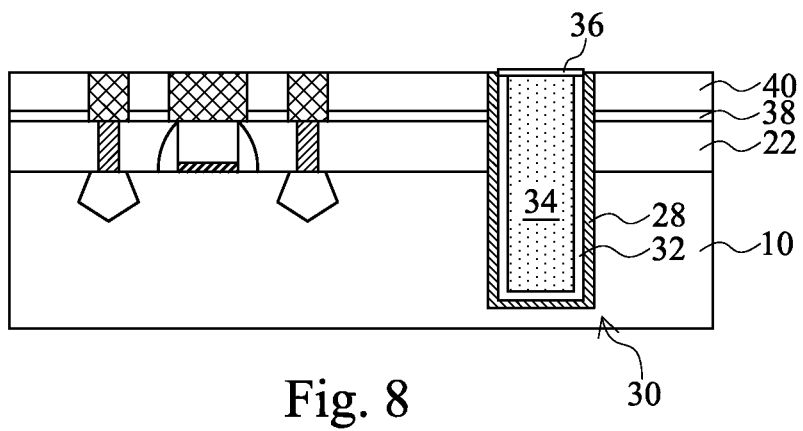
Figure 9:
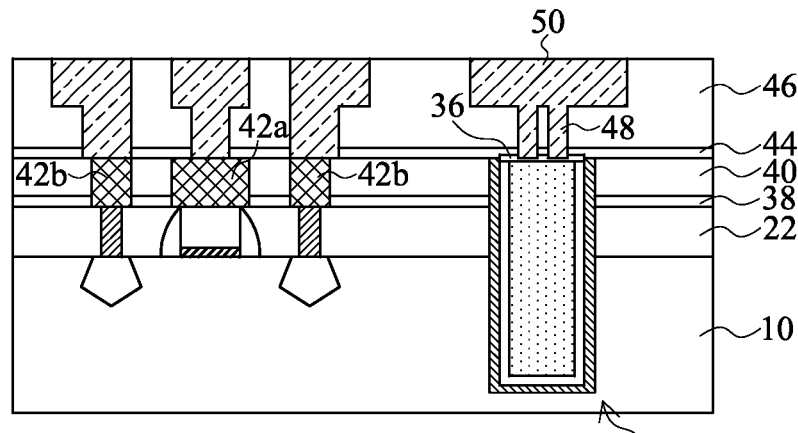

FIGS. 7 through 9 illustrate the formation of the TSV structure 30 after forming the first level of metal layers in accordance with alternative embodiments. Unless specified otherwise, the materials and formation methods of the components in these embodiments are essentially the same as the like components, which are denoted by like reference numerals in the embodiments shown in FIGS. 1 to 6. The details of the like components shown in FIGS. 7~9 may thus be found in the discussion of the embodiments shown in FIGS. 1 to 6.

Referring to FIG. 7, after the formation of the first level of metal layers including the contact vias 42a and 42b in the first etch stop layer 38 and the first IMD layer 40, the opening 26b is formed to penetrate the first IMD layer 40, the first etch stop layer 38, the ILD layer 22 and part of the semiconductor substrate 10. Next, as shown in FIG. 8, the TSV structure 30 including the isolation layer 28, the diffusion barrier layer 32 and the conductive layer 34 is formed in the opening 26b. In an embodiment, the excess portions of the materials positioned outside the opening 26b are removed through a CMP process, and thus the upper surface of the TSV structure 30 is substantially coplanar with the upper surface of first IMD layer 40. Next, the capping layer 36 is formed on the exposed surface of the conductive layer 34 in accordance with an embodiment. The capping layer 36 may extend from the exposed surface of the conductive layer to the exposed surface of the diffusion barrier layer 32 in accordance with some embodiments. The capping layer 36 is a metallization layer including cobalt (Co) or Co-based alloy (such as CoWBP or CoWP). Thereafter, as shown in FIG. 9, the second level of metal layers including metal vias 48 and metal lines 50 are formed in the second etch stop layer 44 and the second IMD layer 46 over the first IMD layer 22. The metal vias 48 and metal lines 50 are formed to electrically connect to the contact vias 42a and 42b and the TSV structure 30. In an embodiment, the metal via 48 is in physical contact with the capping layer 36. Alternatively, the metal via 48 can penetrate the capping layer 36 to land on the conductive layer 34 of the TSV structure 30. In subsequent processes, more metal layers (not shown) may be formed over metal lines 50. Another etch stop layer may then be formed, and further metal lines and vias (not shown) may be formed in more dielectric layers to electrically couple to TSV structure 30 and the contact plugs 24.

Figure 10:
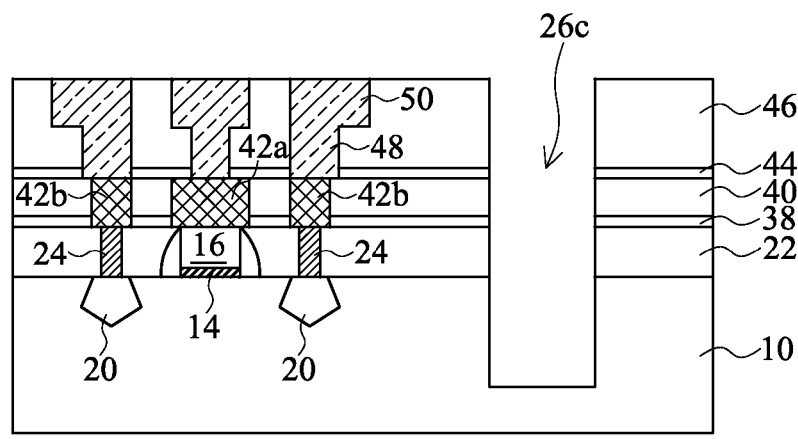
FIGS. 10 to 11 are cross-sectional views of a device with a through-substrate via structure formed after the formation of second level of metal layers in accordance with yet alternative embodiments.
Figure 11:
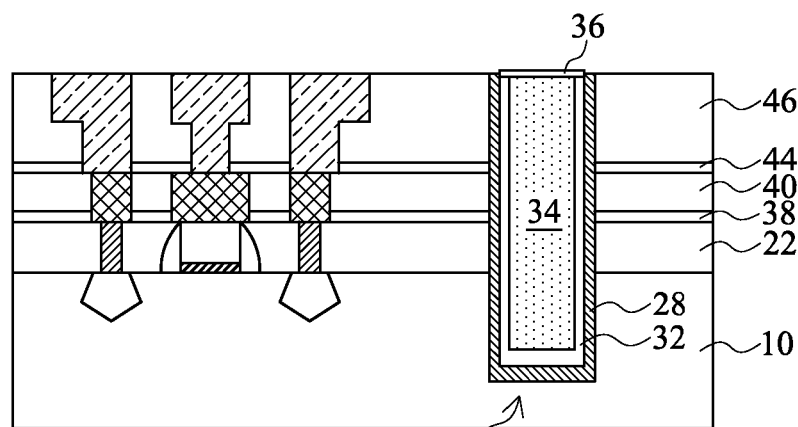

FIGS. 10 and 11 illustrate the formation of the TSV structure 30 after forming the second level of metal layers in accordance with alternative embodiments. Unless specified otherwise, the materials and formation methods of the components in these embodiments are essentially the same as the like components, which are denoted by like reference numerals in the embodiments shown in FIGS. 1 to 6. The details of the like components shown in FIGS. 10 and 11 may thus be found in the discussion of the embodiments shown in FIGS. 1 to 6.

Referring to FIG. 10, after the formation of metal vias 48 and metal lines 50 in the second etch stop layer 44 and the second IMD layer 46, the opening 26c is formed to penetrate the second IMD layer 46, the second etch stop layer 44, the first IMD layer 40, the first etch stop layer 38, the ILD layer 22 and a part of the semiconductor substrate 10. Next, as shown in FIG. 11, the TSV structure 30 including the isolation layer 28, the diffusion barrier layer 32 and the conductive layer 34 is formed in the opening 26c according to an embodiment. In some embodiments, the excess portions of the materials positioned outside the opening 26c are removed, through a CMP process. Thus, the upper surface of the TSV structure 30 is substantially coplanar with the upper surface of second IMD layer 46. Next, the capping layer 36 is formed on the exposed surface of the conductive layer 34 in accordance with an embodiment. The capping layer 36 may extend from the exposed surface of the conductive layer to the exposed surface of the diffusion barrier layer 32 in accordance with some embodiments. The capping layer 36 is a metallization layer including cobalt (Co) or a Co-based alloy (such as CoWBP or CoWP). In subsequent process, more metal layers (not shown) may be formed over metal lines 50. Another etch stop layer may then be formed, and further metal lines and vias (not shown) may be formed in more dielectric layers to electrically couple to TSV structure 30 and the contact plugs 24.

In accordance with embodiments, a device includes a first dielectric layer on a semiconductor substrate, a gate electrode formed in the first dielectric layer, and a through-substrate via (TSV) structure penetrating the first dielectric layer and extending into the semiconductor substrate. The TSV structure includes a conductive layer, a diffusion barrier layer surrounding the conductive layer and an isolation layer surrounding the diffusion barrier layer. A capping layer including cobalt is formed on the top surface of the conductive layer of the TSV structure.

In accordance with other embodiments, a device includes a source/drain region formed on a semiconductor substrate, a first dielectric layer on the semiconductor substrate and the source/drain region, a contact plug formed in the first dielectric layer and electrically connected to the source/drain region, a second dielectric layer formed on the first dielectric layer, a through-substrate via (TSV) structure penetrating the second dielectric layer and the first dielectric layer and extending into the semiconductor substrate, and a capping layer including cobalt formed on the top surface of the conductive layer of the TSV structure. The TSV structure includes a conductive layer, a diffusion barrier layer surrounding the conductive layer and an isolation layer surrounding the diffusion barrier layer.

In accordance with yet other embodiments, a method of forming a device with a through-substrate via (TSV) structure, including: providing a semiconductor substrate having a frontside surface and a backside surface; forming a source/drain region in the semiconductor substrate adjacent to the frontside surface; forming a first dielectric layer on the semiconductor substrate and the source/drain region; forming a contact plug in the first dielectric layer and electrically connected to the source/drain region; forming a second dielectric layer overlying the first dielectric layer; forming an opening penetrating the second dielectric layer and the second dielectric layer and extending into the semiconductor substrate, wherein the opening comprising a sidewall portion and a bottom portion; forming an isolation layer lining the sidewall portion and the bottom portion of the opening; forming a diffusion barrier on the isolation layer along the sidewall portion and the bottom portion of the opening; forming a conductive layer on the diffusion layer to fill the opening; and forming a capping layer comprising cobalt formed on the top surface of the conductive layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate;
   a first dielectric layer over a major surface of the semiconductor substrate;
   a gate electrode formed in the first dielectric layer;
   a through-substrate via (TSV) structure extending through the first dielectric layer and into the semiconductor substrate at a first depth, wherein the TSV structure comprises a conductive layer at a center of the TSV structure, a diffusion barrier layer surrounding and contacting the conductive layer and an isolation layer surrounding the diffusion barrier layer; and
   a capping layer comprising cobalt formed on top surfaces of the conductive layer and the diffusion barrier layer of the TSV structure, wherein an end of the capping layer is substantially aligned with an interface between the diffusion barrier layer and the isolation layer and not aligned with an interface between the isolation layer and the semiconductor substrate, and wherein the capping layer extends from below a top surface of the isolation layer to above the top surface of the isolation layer, wherein the top surface of the isolation layer is substantially parallel to the major surface of the semiconductor substrate.

2. The device of claim 1, wherein a top surface of the TSV structure is substantially level with a top surface of the first dielectric layer.

3. The device of claim 1, further comprising:
   a second dielectric layer on the first dielectric layer, the TSV structure and the capping layer; and
   a contact via formed in the second dielectric layer and electrically connected to the TSV structure.

4. The device of claim 3, wherein the contact via is in physical contact with the capping layer.

5. The device of claim 3, wherein the contact via penetrates the capping layer and is in physical contact with the conductive layer of the TSV structure.

6. The device of claim 3, further comprising an etch stop layer between the first dielectric layer and the second dielectric layer.

7. The device of claim 3, further comprising another contact via formed in the second dielectric layer and electrically connected to the gate electrode.

8. The device of claim 3, wherein a portion of the capping layer is disposed between the conductive layer and an interface, wherein the interface is shared between a surface of the contact via and the capping layer, and wherein the surface of the capping layer is substantially parallel to the major surface of the semiconductor substrate.

9. The device of claim 1, wherein the capping layer comprises a cobalt-based alloy, and the conductive layer of TSV structure comprises copper.

10. The device of claim 1, further comprising:
    a second dielectric layer over the first dielectric layer, wherein the TSV structure further extends through the second dielectric layer; and
    a first via formed in the second dielectric layer and electrically connected to the gate electrode.

11. The device of claim 10, further comprising:
    a third dielectric layer over the second dielectric layer, and
    a second via and a third via formed in the third dielectric layer, wherein the second via and the third via are electrically connected to the first via and the TSV structure, respectively.

12. The device of claim 1, wherein the isolation layer contacts the diffusion barrier layer on a first side and the semiconductor substrate on a second side opposite to the first side, wherein a center of the conductive layer and a perimeter of the conductive layer contacting the diffusion barrier layer comprise a same material, wherein a constitution of a third side of the diffusion barrier layer is the same as a constitution of a fourth side of the diffusion barrier layer, wherein the third side contacts the conductive layer and the fourth side contacts the isolation layer, and wherein the semiconductor substrate and the isolation layer form a solid-solid interface extending from a top surface of the semiconductor substrate to the first depth.

13. A device comprising:
    a semiconductor substrate;
    a source/drain region formed in the semiconductor substrate;
    a first dielectric layer over a major surface of the semiconductor substrate and the source/drain region;
    a contact plug formed in the first dielectric layer and electrically connected to the source/drain region;
    a second dielectric layer formed on the first dielectric layer;
    a through-substrate via (TSV) structure penetrating the second dielectric layer and the first dielectric layer and extending into the semiconductor substrate, wherein the TSV structure comprises a conductive layer at a center of the TSV structure, a diffusion barrier layer surrounding and contacting the conductive layer and an isolation layer surrounding the diffusion barrier layer, wherein the isolation layer is interposed between and in contact with the diffusion barrier layer and the semiconductor substrate; and
    a capping layer comprising cobalt formed on top surfaces of the conductive layer and the diffusion barrier layer of the TSV structure, wherein a lateral dimension of the capping layer is substantially equal to a lateral dimension measured from a first interface between the diffusion barrier layer and the isolation layer to a second interface between the diffusion barrier layer and the isolation layer, wherein the lateral dimension of the capping layer is less than a lateral dimension measured from a first interface between the isolation layer and the semiconductor substrate to a second interface between the isolation layer and the semiconductor substrate, wherein a top surface of the capping layer is higher than a top surface of the isolation layer, wherein the top surface of the isolation layer intersects a sidewall of the capping layer, wherein the top surface of the isolation layer is substantially parallel to the major surface of the semiconductor substrate, and wherein the sidewall of the capping layer is substantially perpendicular to the major surface of the semiconductor substrate.

14. The device of claim 13, further comprising:
a third dielectric layer on the second dielectric layer, the TSV structure and the capping layer; and
a contact via formed in the third dielectric layer and electrically connected to the TSV structure.

15. The device of claim 14, wherein the contact via is in physical contact with the capping layer.

16. The device of claim 14, wherein the contact via penetrates the capping layer and is in physical contact with the conductive layer of the TSV structure.

17. The device of claim 14, further comprising an etch stop layer between the second dielectric layer and the third dielectric layer.

18. The device of claim 13, wherein a top surface of the TSV structure is substantially level with a top surface of the second dielectric layer.

19. A device comprising:
a first dielectric layer over a major surface of a substrate;
a first etch stop layer (ESL) and a second dielectric layer formed successively over the first dielectric layer;
a second ESL and a third dielectric layer formed successively over the second dielectric layer;
a through-substrate-via (TSV) structure extending through the second dielectric layer and the first dielectric layer and extending into the substrate, the TSV structure comprising:
 a conductive layer extending from a center of the TSV structure to a diffusion barrier layer surrounding the conductive layer, wherein a center of the conductive layer and a sidewall of the conductive layer both comprise a same material, with the sidewall of the conductive layer in contact with the diffusion barrier layer, and wherein a composition of the diffusion barrier layer remains the same along a direction from an inner surface of the diffusion barrier layer contacting the conductive layer to an outer surface of the diffusion barrier layer opposite the inner surface; and
 an isolation layer surrounding and contacting the diffusion barrier layer, the isolation layer contacting the substrate and forming an interface between the isolation layer and the substrate, wherein the substrate at the interface has a homogenous formation along a longitudinal direction of the TSV structure;
a capping layer formed over a top surface of the conductive layer of the TSV structure, wherein the second ESL is disposed over and extends along a sidewall of the capping layer, wherein the sidewall of the capping layer is substantially perpendicular to the major surface of the substrate, and wherein the isolation layer also extends along the sidewall of the capping layer;
a gate electrode formed in the first dielectric layer;
a first via formed in the second dielectric layer, the first via electrically connected to the gate electrode; and
a second via and a third via formed in the third dielectric layer, the second via and the third via electrically connected to the first via and the TSV structure, respectively.

* * * * *